United States Patent [19]

Cushman

[11] Patent Number: 4,627,161
[45] Date of Patent: Dec. 9, 1986

[54] METHOD FOR INSERTING MULTILEAD COMPONENTS INTO PRINTED WIRING BOARDS

[75] Inventor: Robert H. Cushman, Princeton, N.J.

[73] Assignee: AT&T Technologies, Inc., Berkeley Heights, N.J.

[21] Appl. No.: 747,694

[22] Filed: Jun. 24, 1985

Related U.S. Application Data

[63] Continuation of Ser. No. 562,956, Dec. 19, 1983, abandoned.

[51] Int. Cl.⁴ .............................................. H05K 3/30
[52] U.S. Cl. ........................................ 29/838; 29/741; 29/845; 414/730
[58] Field of Search ................. 29/837, 838, 845, 741; 414/730; 140/147

[56] References Cited

U.S. PATENT DOCUMENTS

| | | |
|---|---|---|
| 4,286,380 | 9/1981 | Blount . |
| 4,316,321 | 2/1982 | Wickham . . |
| 4,328,613 | 5/1982 | Kirkpatrick ........................... 29/845 |
| 4,372,044 | 2/1983 | Chisholm .............................. 29/845 |
| 4,472,668 | 9/1984 | Mutschler et al. ................ 29/741 X |

FOREIGN PATENT DOCUMENTS 147451 4/1981 German Democratic Rep.
149298 7/1981 German Democratic Rep. ... 29/837

Primary Examiner—Howard N. Goldberg
Assistant Examiner—Carl J. Arbes
Attorney, Agent, or Firm—M. de Picciotto; R. B. Levy

[57] ABSTRACT

A method for inserting a multilead component (30) into a printed wiring board (31) (PWB), wherein the component has its leads (32, 33) arranged in two or more rows and the PWB (31) has two or more rows of apertures (36, 37) arranged in a pattern corresponding to that of the leads of the component. The method comprises spreading the lead rows of the component (30) further apart than the aperture rows of the PWB (31); placing the component on the PWB (31) and applying a downward insertion force (41) thereon; vibrating the component (30) and the PWB (31) relative to each other; and moving the lead rows toward the aperture rows thereby inserting each lead in its corresponding aperture in the PWB.

21 Claims, 6 Drawing Figures

METHOD FOR INSERTING MULTILEAD COMPONENTS INTO PRINTED WIRING BOARDS

This is a continuation of application Ser. No. 562,956, filed Dec. 19, 1983, now abandoned.

TECHNICAL FIELD

The present invention is directed to a technique for mounting components on substrates having a plurality of apertures formed therein, and more particularly, to a method for inserting multilead components into through holes of a circuit board.

BACKGROUND OF THE INVENTION

The production of electrical and electronic circuit boards often requires the mounting of several multilead electrical and electronic components on substrates having apertures adapted to receive the component's leads. Usually, such mounting techniques involve manual insertion of the leads of each multilead component in corresponding holes or apertures of the substrate or the circuit board. Electronic components and devices, such as semiconductor integrated circuit (I.C.) packages, are becoming small in size resulting in substantially smaller size leads. Moreover, the number of leads on each one of such IC packages has been increasing to achieve higher packaging densities. The miniaturization of the IC packages renders unattractive any technique using manual insertion of the leads into the circuit board. Indeed, in a manufacturing environment, such a technique would yield small throughput, would be time consuming and labor intensive, and would cause substantial problems of operator fatigue.

Several attempts were made to avoid the above hindrances of manual insertion of multilead components into circuit boards by resorting to automation. In the area of automatically mounting the multilead component or the I.C. package on a printed wiring board (PWB), the emphasis has been to accurately align and position all the leads of the component or the I.C. package over the receiving mating holes in the PWB. Typically, once the holes and the component's leads are aligned, a downward force is applied to the component in order to simultaneously push its leads into their corresponding receiving mating holes of the PWB. One necessary condition for the successful implementation of such known technique is that not a single lead of the component may be bent. Another necessary condition is that very strict positioning tolerances must be respected in order to align the leads and the holes to successfully insert each lead into its corresponding hole. Clearly, such strict positioning requirements do not and cannot compensate for any dimensional deviations existing between the outer housing of the component or package and its leads.

Therefore, there exists a need for a simple, accurate, and reliable technique for inserting a multilead component into a PWB while substantially avoiding the above-discussed strict requirements.

SUMMARY OF THE INVENTION

The foregoing need is met in an illustrative embodiment of the present invention wherein a method for mounting a multilead component on a substrate having a plurality of apertures arranged in a pattern and adapted to receive the leads of the component comprises the steps of placing the component with its leads on the substrate such that the pattern of the apertures is within the tip portions of the leads, applying a force on the component in a direction substantially perpendicular to the plane of the substrate, vibrating the component and the substrate relative to each other, and moving the tip portions of the leads toward the apertures thereby inserting each lead in a corresponding aperture in the substrate.

In accordance with another illustrative embodiment of the invention, the method for mounting the multilead component on a board comprises the steps of spreading the leads of the component away from the pattern of the apertures, placing the component with its spread out leads on the board such that each lead of the component is distant from a corresponding aperture in the board, applying a force on the component in a direction substantially perpendicular to the plane of the board, vibrating the component and the board relative to each other, and moving the spread out leads toward the apertures thereby inserting each lead in its corresponding aperture in said board.

A specific embodiment of the invention is directed to a method for mounting a multilead electronic component, having its leads arranged in a plurality of rows, on a board having a plurality of rows of apertures arranged in a pattern corresponding to that of the leads of the component. The method comprises the steps of outwardly spreading the lead rows of the component further apart than the aperture rows of the board, placing the component with its spread out leads on the board such that each lead is distant from a corresponding aperture in the board, applying a downward force on the component, vibrating the component and the board relative to each other, and inwardly moving the lead rows toward the aperture rows thereby inserting each lead in its corresponding aperture in the board.

DETAILED DESCRIPTION

Figure 1:
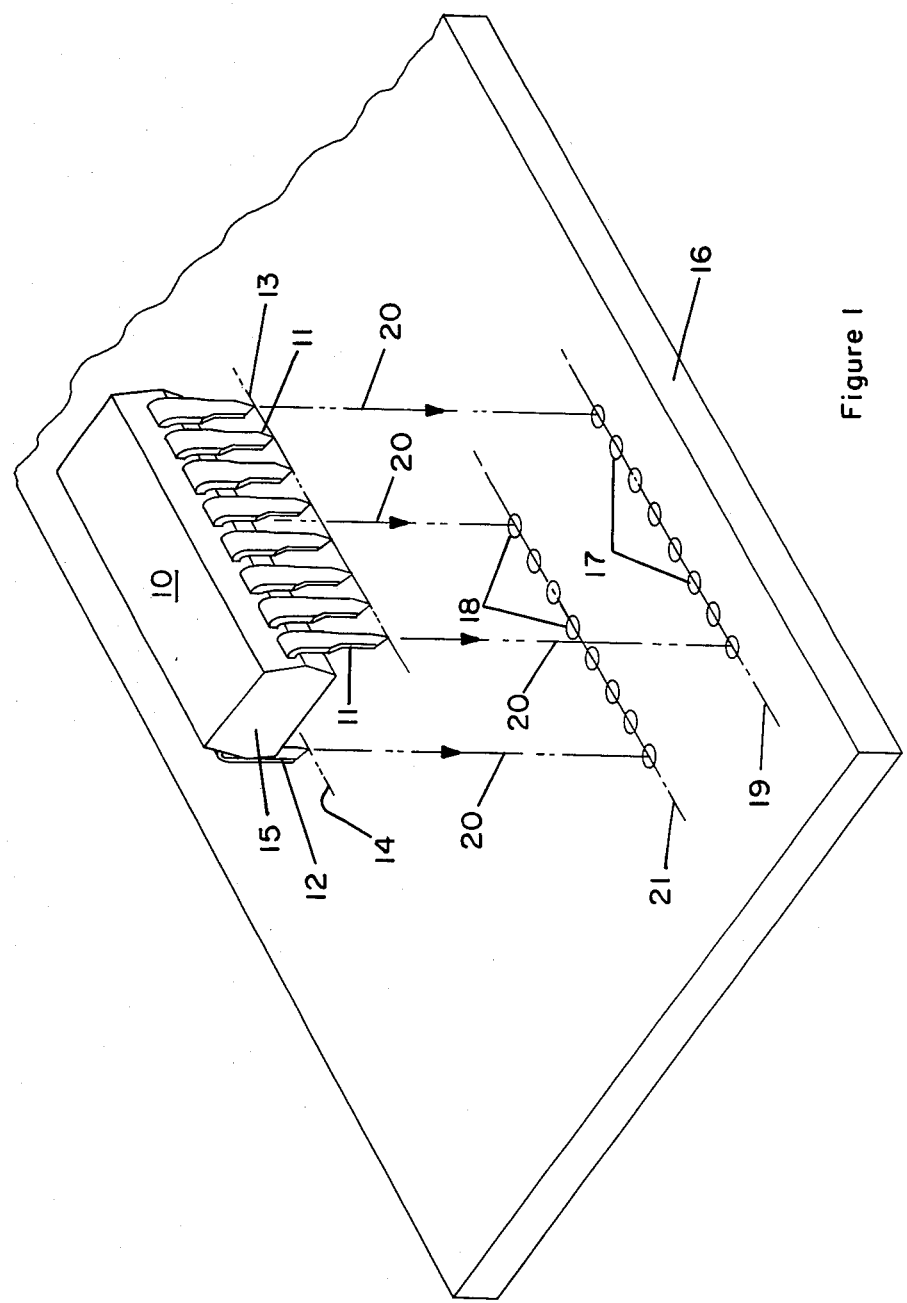
FIG. 1 is a perspective view of an illustrative multilead component to be mounted on a board using an embodiment of the method of the present invention.

Illustratively shown in FIG. 1 is a component 10 having a plurality of leads 11 and 12 arranged in two rows 13 and 14 on each side of such component. Such a component 10 (which is shown having a total number of sixteen leads) is often referred to as a DIP (Dual In-line Package). DIP's with 24 or 48 leads are well known, and are commercially available. Other Hybrid Integrated Circuits (HIC's) and DIPs comprising 100 or more leads are becoming available. The component 10 is to be mounted on a substrate 16 having a plurality of apertures 17 and 18 arranged in two rows 19 and 21. The leads 11 and 12 of the multilead component 10 are to be inserted in corresponding apertures 17 and 18 of the substrate 16 as schematically illustrated by phantom lines 20. The substrate apertures are arranged in a pattern substantially corresponding to that of the leads 11 and 12 of the component 10. The substrate 16 may be selected from any well known support members adapted to receive and hold in their apertures (17 and 18) the leads (11 and 12) of the component 10. Such a substrate 16 may include, for example, a ceramic substrate used to support one or a plurality of multilead components; a flexible or a rigid circuit board; a PWB; or any other commonly used commercially available electronic component support member.

The component 10, as shown, has an outer body housing 15 generally shaped as a parallelepiped. However, the hereafter described inventive concepts are also applicable to components having cylindrical, cubical or any other outer body shape. Also, the leads 11 and 12, and in turn their corresponding apertures 17 and 18, may be arranged in any type of pattern, such as circular, rectangular, square, or other geometric configurations. Moreover, the present inventive concepts and teachings will be described hereafter with reference to the mounting of multilead components (such as component 10) on boards (such as substrate 16), such multilead components containing electrical devices, electronic circuits, memory circuits, logic circuits or any combination thereof.

FIGS. 2A to 2D schematically illustrate a dynamic alignment technique for mounting a multilead component 30 on a board 31 in accordance with an embodiment of the present invention. As described in connection with the multilead component 10 of FIG. 1, the component 30 has a plurality of leads arranged in two rows of leads of which only lead 32 of one row of leads is shown, and leads 33 and 34 of the other row of leads are shown. Also, as mentioned in connection with the substrate 16 of FIG. 1, the board 31 has a plurality of apertures arranged in two rows in a pattern corresponding to that of the leads of the component 30. For purpose of illustration, only two apertures 36 and 37 in the board 31 are shown in the drawings. However, each aperture 36 or 37 represents one aperture out of the plurality of apertures arranged in two rows of apertures.

Figure 2A:
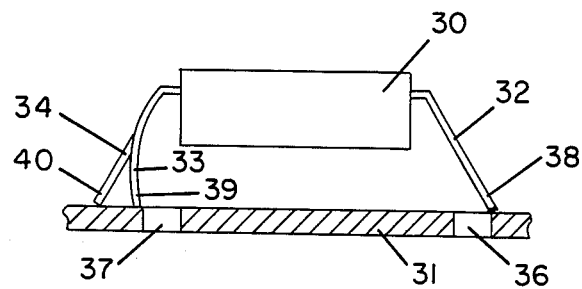
FIGS. 2A–2D are schematic representations of the multilead component insertion principles in accordance with an embodiment of the present invention.

In FIG. 2A, which shows an end view of the component 30 and the board 31, the component 30 has its two leads 32 and 34 somewhat spread out, and lead 33 severely bent for purposes of illustration only. The lead 33 may have been bent as the result of some manufacturing defects, or of some damage caused to the leads during the transport and/or storage of the component 30, or for some other reasons When using conventional prior art multilead component insertion techniques, such a bent lead 33 would prevent successful insertion of the component 30 into the board 31.

In accordance with an embodiment of the present invention, the component 30 is placed with its leads 32, 33, 34 on the board 31 such that their respective tip portions 38, 39 and 40 are distant from their corresponding apertures in the board 31. In other words, the component 30 is placed on the board 31 such that the pattern of the apertures of the board 31 is somewhat smaller and within the pattern of corresponding leads of the component 30. The latter may be manufactured with a larger lead pattern than that of the apertures of the board 31. Alternatively, the board 31 may be provided with a somewhat smaller aperture pattern than that of the leads of the component 30. Preferably, prior to placing the component 30 on the board 31, the two rows of leads of the component 30 are spread out further apart than the two aperture rows of the board 31 thereby insuring that the lead pattern is larger than that of the apertures.

Figure 2B:
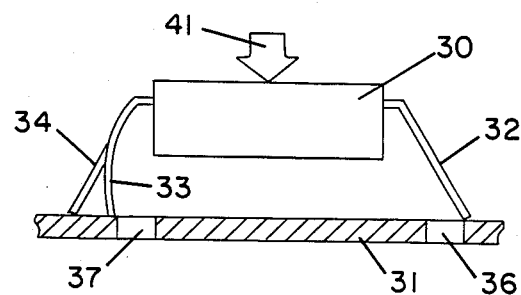

As next shown in FIG. 2B, a downward force illustrated by arrow 41 is applied on the component 30 in a direction substantially perpendicular to the plane or major surface of the board 31. In accordance with this embodiment, the force 41 is applied on the component 30 even though the tip portions 38, 39 and 40 of leads 32, 33 and 34 are not in alignment with their corresponding apertures, such as apertures 36 and 37 for the case of leads 32 and 33. Typically, the force applied on the component 30 is of the order of 1 ounce per lead times the total number of leads of the component 30.

Figure 2C:
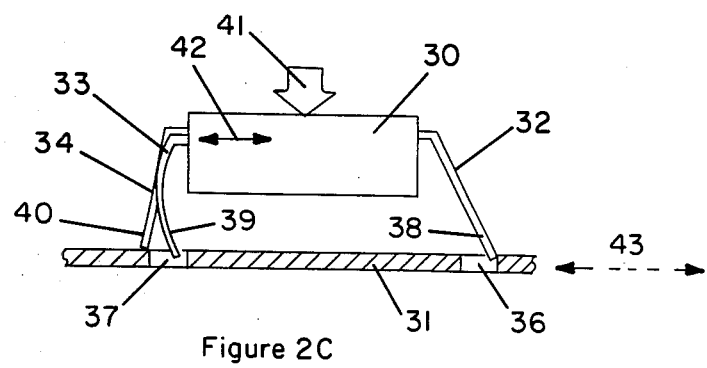

FIG. 2C shows the next step of the dynamic alignment component insertion technique of the present invention, which step comprises vibrating the component 30 and the board 31 relative to each other. This vibrating step may include imparting a vibratory motion to the component 30 with the board 31 stationary as illustrated by the bidirectional arrow 42. Such a component vibratory motion may be along a single direction substantially parallel to the plane of the board 31, or along several directions all substantially parallel to the plane of the board 31. Preferably such a component vibratory motion is substantially in the direction of the rows of apertures of the board 31.

Alternatively, the vibrating step may include imparting a vibratory motion to the board 31 as illustrated by bidirectional arrow 43. Such a board vibratory motion may be along a single direction in the plane thereof, or along a plurality of directions in the plane of the board 31. A vibrating step including a relatively low frequency vibration (of the order of 5 cycles per sec.) in substantially the direction of the rows of leads and apertures has been found advantageous.

Figure 2D:
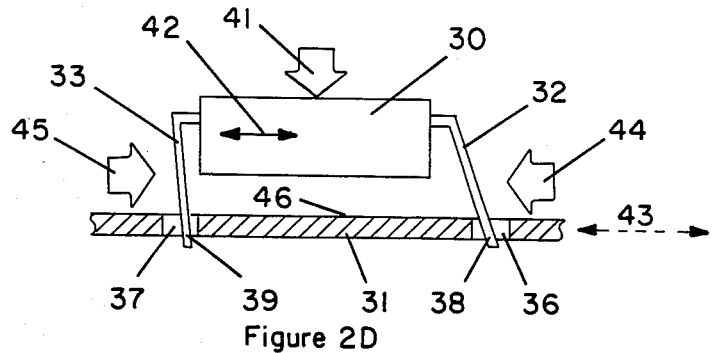

Schematically illustrated in FIG. 2D is the next step of the dynamic alignment component insertion technique of the present invention. While the force 41 is applied on the component 30 during the relative vibration of the component 30 and the board 31, the tip portions 38 and 39 of the leads 32 and 33 are moved toward the apertures 36 and 37, respectively, as schematically illustrated by oppositely poled arrows 44 and 45. The velocity of movement of each lead tip portion is related to the frequency of relative vibratory motion of the component and the board such that the movement of a tip portion is substantially slower than that of the component relative to the board, or that of the board relative to the component. Insertions were successfully achieved with vibratory motions of the order of 5 cycles per sec. and lead tip portion movements during approximately 0.5 sec.

The combined effect of the downward force 41, the vibratory motion 42 or 43, and the movement of the tip portions of the leads illustrated by arrows 44 and 45 results in leads of a row of leads being sequentially, or simultaneously, inserted in their corresponding apertures in the board 31. The downward force 41 on the component 30 may cause the leads 32, 33, 34 to deflect so that one or more leads may line up with the apertures of the board. The spring characteristics of a lead resulting from its deflection causes the tip portions some of the leads to enter their corresponding apertures and to remain therein until the tip portions of all other leads have entered their corresponding apertures. Once all the lead tip portions have entered their apertures, the leads are now free to proceed further into the apertures thereby completing insertion of the component.

The movement of the tip portions of the leads may be achieved, for example, by engaging each tip portion 38, 39, 40 of the leads in a comb (not shown) positioned proximate to the surface 46 of the board 31, and by displacing the comb toward the apertures of the board 31 in a direction parallel to the surface 46 thereof. Typically, such a comb would have a plurality of slots, each slot being adapted to receive a tip portion of a lead. Tools using combs for inserting a plurality of leads into corresponding apertures are well known in the art, see for example, U.S. Pat. No. 4,316,321 to T. J. Wickham.

Figure 3:
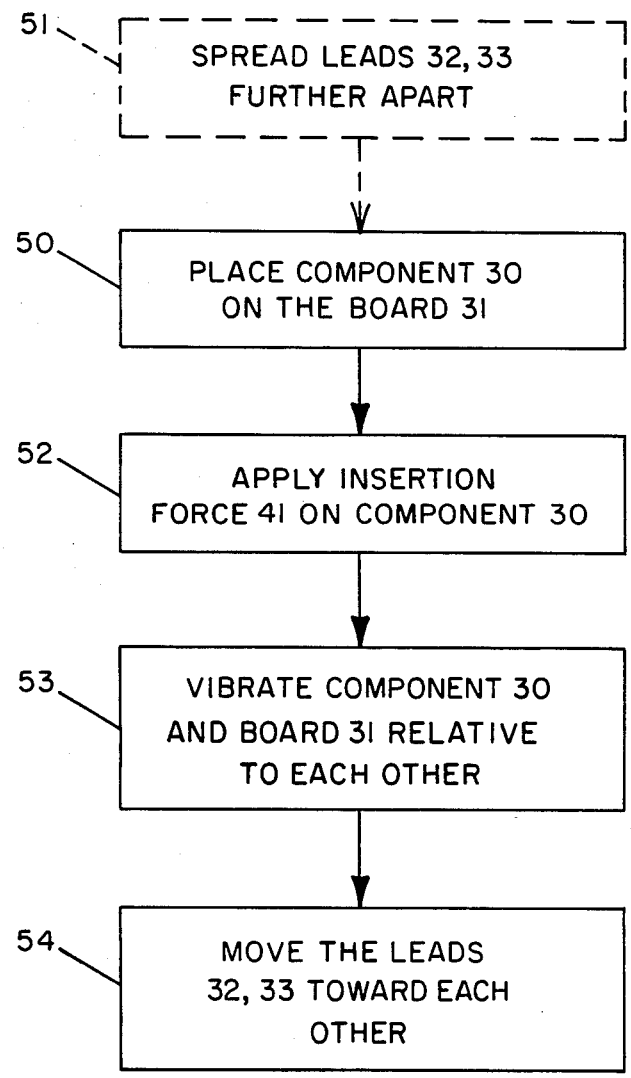
FIG. 3 is a flow chart representation of the steps involved in the operation of an embodiment of the present invention.

The foregoing operational steps of an embodiment of the invention are illustrated in a flow chart configuration shown in FIG. 3. The placing of the component 30 on the surface of the board 31 is shown in block 50. Such a placing may be done manually, or alternatively, a robotic arm may be used to pick-up a component 30 and place such component at predetermined coordinate positions on the board 31 under computer control. Prior to placing the multilead component 30 on the board 31, it may be desirable to ascertain that the lead pattern of the component 30 is somewhat larger than the row pattern of the board 31. Thus, a lead spreading step, as illustrated by block 51, may be performed, for example, by placing the component 30 on a trapezoidal forming structure having its two non-parallel sides at a distance from each other that is larger than the distance between the two rows of apertures of the board 31. By placing the component 30 on the forming structure and applying a downward force on the component 30, the two rows of leads of the component would spread apart.

Once the component 30 is placed on the board 31, a downward force is applied on the component as illustrated by block 52. Various means and techniques can be used to apply such a force on the component 30. For example, if using a robotic arm to implement the multilead component insertion, the arm may be programmed to apply such a downward force on the component once the latter is placed on the board. Alternatively, if an insertion tool is used, such tool may comprise a spring and shaft mechanism capable of imparting the downward force 41 on the component 30.

The vibration of the component 30 and the board 31 relative to each other (shown by block 53), and the movement of the tip portions of the leads toward each other and toward the apertures of the board (shown by block 54) may be achieved by using any one of the above-discussed techniques.

It is to be understood that the above-described embodiments are simply illustrative of the principles of the invention. Various other modifications and changes may be devised by those skilled in the art which will embody the principles of the invention and fall within the spirit and scope thereof.

What is claimed is:

1. A method for mounting a multilead component on a substrate having a plurality of apertures arranged in a pattern and adapted to receive the leads of said component, the method comprising the steps of:
   placing the component with its leads on the substrate such that the pattern of said apertures is within the tip portions of said leads;
   applying a force on the component in a direction substantially perpendicular to the plane of the substrate;
   vibrating the component and the substrate relative to each other; and
   laterally moving the tip portions of the leads inwardly toward the apertures while simultaneously vibrating the component and substrate relative to each other thereby inserting each lead in a corresponding aperture in said substrate.

2. A method according to claim 1, comprising maintaining the force applying step during the vibrating and the moving steps.

3. A method according to claim 1, wherein prior to the placing step, the method further comprises the step of spreading the tip portions of the leads of the component away from the pattern of said apertures.

4. A method according to claim 1, wherein the vibrating step comprises the step of imparting a vibratory motion to the component in a direction substantially parallel to the plane of the substrate.

5. A method according to claim 1, wherein the vibrating step comprises the step of imparting a vibratory motion to the substrate in a direction substantially parallel to its plane.

6. A method according to claim 1, wherein the moving step comprises the steps of:
   engaging the tip portion of each lead in a comb positioned proximate to the surface of the substrate; and
   displacing the comb, with the leads engaged therein, in a direction substantially parallel to the surface of the substrate.

7. A method for mounting a multilead component on a board having a plurality of apertures arranged in a pattern corresponding to that of the leads of said component, comprising the steps of:
   spreading the leads of the component away from the pattern of said apertures;
   placing the component with its spread out leads on the board such that each lead of said component is distant from a corresponding aperture in said board;
   applying a force on the component in a direction substantially perpendicular to the plane of the board;
   vibrating the component and the board relative to each other; and
   moving the spread out leads toward the apertures while simultaneously vibrating the component and board relative to each other thereby inserting each lead in its corresponding aperture in said board.

8. A method according to claim 7, comprising maintaining the force applying step during the vibrating and the moving steps.

9. A method according to claim 7, wherein the vibrating step comprises the step of imparting a vibratory motion to the component relative to the board.

10. A method according to claim 9, wherein said vibratory motion is in a direction substantially parallel to the plane of the board.

11. A method according to claim 9, wherein said vibratory motion is in directions substantially parallel to the plane of the board.

12. A method according to claim 7, wherein the vibrating step comprises the step of imparting a vibratory motion to the board.

13. A method according to claim 12, wherein said vibratory motion is in a direction substantially parallel to the plane of the board.

14. A method according to claim 13, wherein said vibratory motion is in directions substantially parallel to the plane of the board.

15. A method according to claim 7, wherein the spreading step comprises outwardly moving the tip portions of the leads away from the pattern thereof.

16. A method according to claim 7, wherein the moving step comprises the steps of:

engaging the spread out tip portion of each lead in a comb positioned proximate to the surface of the board; and displacing the comb, with the tip portions of the leads engaged therein, in a direction substantially parallel to the surface of the board.

17. A method for mounting a multilead electronic component having its leads arranged in a plurality of rows on a board having a plurality of rows of apertures arranged in a pattern corresponding to that of the leads of said component, the method comprising the steps of:

outwardly spreading the lead rows of the component further apart than the aperture rows of the board;

placing the component with its spread out leads on the board such that each lead is distant from a corresponding aperture in said board;

applying a downward force on the component;

vibrating the component and the board relative to each other; and inwardly moving the lead rows toward the aperture rows while simultaneously vibrating the component and board relative to each other thereby inserting each lead in its corresponding aperture in said board.

18. A method according to claim 17, comprising maintaining the force applying step during the vibrating and inwardly moving steps.

19. A method according to claim 17, wherein the vibrating step comprises the step of imparting a vibratory motion to the component in directions substantially parallel to the plane of the board.

20. A method according to claim 17, wherein the vibrating step comprises the step of imparting a vibratory motion to the board in directions substantially parallel to its plane.

21. A method according to claim 17, wherein the inwardly moving step comprises the steps of:

engaging each row of the lead rows in a comb positioned proximate to the surface of the board; and displacing the comb in a direction substantially parallel to the surface of the board.

* * * * *